(12) United States Patent
Ryder

(10) Patent No.: US 7,034,547 B2
(45) Date of Patent: Apr. 25, 2006

(54) METHOD OF DIAGNOSING A FAULT ON A TRANSFORMER WINDING

(75) Inventor: Simon Ryder, Oxford (GB)

(73) Assignee: Alstom T&D SA, Paris (FR)

( * ) Notice: Subject to any disclaimer, the term of this patent is extended or adjusted under 35 U.S.C. 154(b) by 43 days.

(21) Appl. No.: 10/722,527

(22) Filed: Nov. 28, 2003

(65) Prior Publication Data

US 2004/0164745 A1    Aug. 26, 2004

(30) Foreign Application Priority Data

Dec. 10, 2002   (FR) .................................. 02 15590
Feb. 7, 2003    (FR) .................................. 03 01499

(51) Int. Cl.
    *G01R 31/06*   (2006.01)
(52) U.S. Cl. ...................... 324/547; 324/546; 324/726
(58) Field of Classification Search ........ 324/546–547, 324/726
    See application file for complete search history.

(56) References Cited

U.S. PATENT DOCUMENTS

| | | | | |
|---|---|---|---|---|
| 4,857,856 | A * | 8/1989 | Coleman et al. | 324/547 |
| 5,396,172 | A * | 3/1995 | Lat et al. | 324/547 |
| 5,455,506 | A * | 10/1995 | Mimeault et al. | 324/547 |
| 6,466,034 | B1 * | 10/2002 | Wang et al. | 324/547 |
| 6,535,000 | B1 * | 3/2003 | Shuey | 324/547 |
| 6,549,017 | B1 * | 4/2003 | Coffeen | 324/547 |

FOREIGN PATENT DOCUMENTS

WO    WO 02/35248    5/2002

OTHER PUBLICATIONS

S. A. Ryder, Conf. Record of 2002 IEEE Int. Symp. on Elect. Insulation, pp. 187-190, XP-001162794, "Methods for Comparing Frequency Response Analysis Measurements", Apr. 2002.

* cited by examiner

*Primary Examiner*—Anjan Deb
*Assistant Examiner*—Marina Kramskaya
(74) *Attorney, Agent, or Firm*—Oblon, Spivak, McClelland, Maier & Neustadt, P.C.

(57) ABSTRACT

The present invention relates to a method of diagnosing a fault on a transformer winding by using frequency response analysis. The method comprises the steps of: measuring the impedance on said winding as a function of frequency, said measurement being represented in the form of a first voltage gain; comparing said impedance measurement with a reference measurement represented in the form of a second voltage gain, said comparison including a step of calculating three first parameters, each of said three first parameters being a correlation coefficient, between said first and second gains over three different frequency ranges. The method further comprises a step of determining the relative variation of at least a fourth parameter, said fourth parameter being a physical magnitude characteristic of said transformer, said relative variation being obtained by comparing said first and second gains.

14 Claims, 3 Drawing Sheets

METHOD OF DIAGNOSING A FAULT ON A TRANSFORMER WINDING

The present invention relates to a method of diagnosing a fault on a transformer winding by using frequency response analysis (FRA). The present invention is more particularly adapted to power transformers.

BACKGROUND OF THE INVENTION

Power transformers (such as transformers having primary voltages of several hundreds of kilovolts (kV) and delivering powers lying in the range a few megavolt amps (MVA) to several hundred MVA) are extremely expensive pieces of equipment in systems for interconnecting electricity transmission networks or "grids". It is therefore very useful to be able to keep such transformers in service for as long as possible, since a transformer breakdown or fault can have major economic consequences due to the distribution network being interrupted.

In addition, faults ouch as short circuits can run the risk of explosion or fire.

It is therefore very important to be able to determine the presence of a fault associated with a transformer winding.

A known solution that problem consists in using FRA. That technique consists in measuring the impedance of a transformer winding over a wide range of frequencies and in comparing the result of the measurement with a set of reference measurements. In order to measure impedance as a function of frequency, it is possible to perform frequency scanning using a sinewave signal.

Thus, FIG. 1 is a theoretical diagram of a circuit 1 for performing frequency analysis on an impedance corresponding to the impedance of a transformer winding that is to be measured.

The circuit 1 comprises:

a network analyzer 2;

three same-value test impedances Z1; and an impedance ZT corresponding to the impedance to be measured of a transformer winding.

The network analyzer 2 generates a measurement signal S. The measurement signal S is a frequency-scanned sinewave signal. By way of example, the impedances Z1 are the impedances of measurement cables and they generally have a value that is equal to 50 ohms (Ω). R is the signal measured between the first end of ZT and ground. T is the signal measured between the second end of ZT and ground. The analyzer 2 then determines voltage gain k as a function of frequency, as defined by the following relationship:

$$k = 20\log_{10}\left(\frac{T}{R}\right)$$

The gain k contains the information needed for studying the impedance ZT and is equal to:

$$k = 20\log_{10}\left(\frac{Z1}{Z1+ZT}\right)$$

When the impedance Z1 is equal to 50 Ω, this gives:

$$k = 20\log_{10}\left(\frac{50}{50+ZT}\right)$$

Impedance is measured over a very wide range of frequencies that can extend from a few hertz (Hz) to about 10 megahertz (MHz).

The same measurement must be performed on a reference winding. The reference winding can either be another phase which is assumed to have no fault, or the same winding as measured previously when it had no fault, or the winding of an identical transformer. This measurement likewise produces a gain k' as a function of frequency and corresponding to the reference winding.

A first solution then consists in examining by eye any differences between the curves representing k and k' as a function of frequency. That solution nevertheless presents certain problems.

An examination by eye performed by an expert can be highly subjective and can lack transparency.

A second solution consists in calculating statistical indicators suitable for revealing the differences between the two curves. Such statistical indicators can be constituted, for example, by correlation coefficients calculated over different frequency ranges.

Nevertheless, the use of such statistical indicators also gives rise to certain problems.

Thus, certain faults cannot be identified; this applies for example to the magnetic circuit of the transformer being grounded or to circulating current causing the winding to heat.

Similarly, such use of statistical indicators can lead to certain faults being confused; for example poor grounding of the transformer tank can be confused with damage to a winding.

OBJECTS AND SUMMARY OF THE INVENTION

The present invention seeks to provide a method of diagnosing a fault on a transformer winding serving both to increase the number of faults that are detectable and to distinguish between different faults.

For this purpose, the invention provides a method of diagnosing a fault on a transformer winding, the method comprising the following steps:

measuring the impedance on said winding as a function of frequency, said measurement being represented in the form of a first voltage gain;

comparing said impedance measurement with a reference measurement represented in the form of a second voltage gain, said comparison including a step of calculating three first parameters, each of said three first parameters being a correlation coefficient, between said first and second gains over three different frequency ranges;

said method comprising a step of determining the relative variation of at least a fourth parameter, said fourth parameter being a physical magnitude characteristic of said transformer, said relative variation being obtained by comparing said first and second gains.

By means of the invention, three correlation coefficients are combined with the relative variation of at least a fourth parameter enabling certain faults to be identified that are not detected by the values of the correlation coefficients.

Depending on the value of the relative variation of said fourth parameter, it is also possible to resolve doubt between various possible faults.

Advantageously, said fourth parameter is selected from minimum gain, fundamental resonant frequency, and number of resonant frequencies present above a predetermined frequency.

Advantageously, said minimum gain is determined for a frequency below 10 kilohertz (kHz).

The minimum gain is defined as the minimum value taken by the voltage gain k as described with reference to FIG. 1 as a function of measurement frequency; the minimum gain to be determined is the minimum gain at a frequency of less than 10 kHz. It can happen that this gain takes a minimum value at a higher frequency, but this value is less pertinent in identifying faults.

Advantageously, said three different frequency ranges are respectively: [1 kHz to 10 kHz], [10 kHz to 100 kHz], and [100 kHz to 1 MHz].

It turns out that the correlation coefficients calculated at below 1 kHz are less pertinent, and that those calculated above 1 MHz give information that is unreliable.

In a particularly advantageous embodiment, said method includes a step of determining the relative variation of at least a fifth parameter and a sixth parameter, said fifth and sixth parameters being characteristics of said transformer, said relative variation being obtained by comparing said first and second gains.

In this implementation, said fourth parameter is minimum gain, said fifth parameter is fundamental resonant frequency, and said sixth parameter is number of resonant frequencies present above a predetermined frequency.

In highly advantageous manner, said method includes a step of determining a plurality of diagnosis codes, each of said codes indicating whether a respective one of said parameters belongs to a predetermined range of values.

In this embodiment, said method includes a step of determining the presence of a fault and of identifying said fault as a function of said plurality of diagnosis codes.

Advantageously, said step of determining the presence of a fault and of identifying said fault is performed by comparing said plurality of codes with codes stored in a search table.

BRIEF DESCRIPTION OF THE DRAWINGS

Other characteristics and advantages of the present invention appear from the following description of an embodiment of the invention given purely by way of non-limiting illustration.

In the following figures.

MORE DETAILED DESCRIPTION

Figure 1:
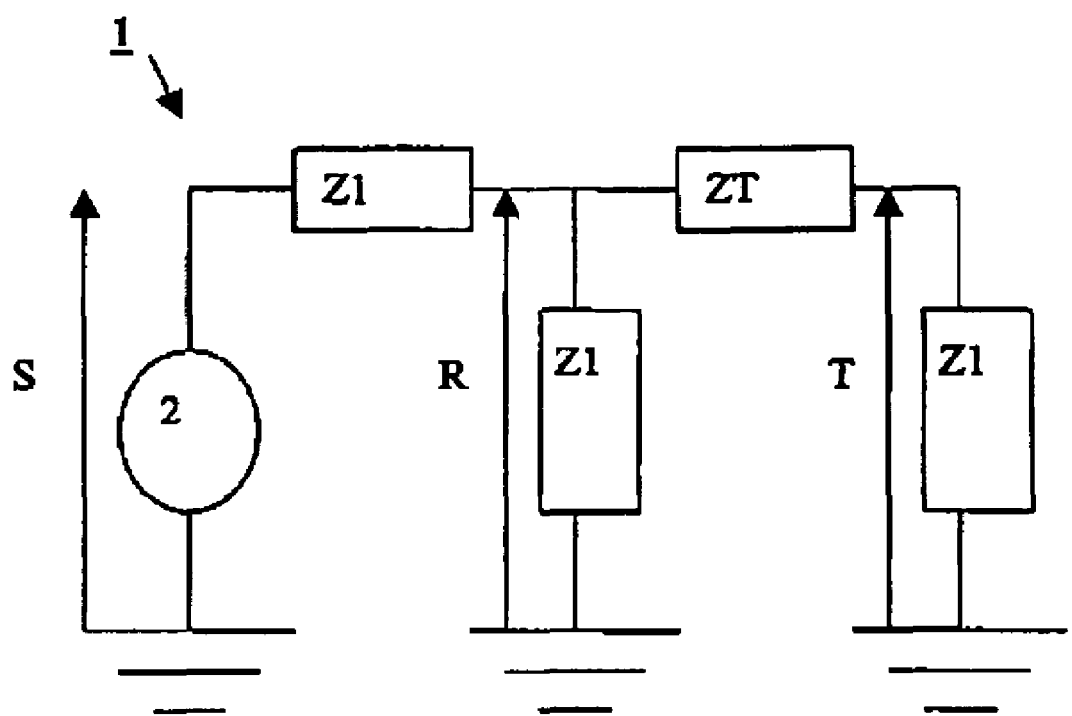
FIG. 1 is a diagram of a circuit for analyzing the frequency response of an impedance.

FIG. 1 is described above with reference to the state of the art. The FRA measurements described below were all taken using an analysis circuit of the kind shown in FIG. 1.

Figure 2:
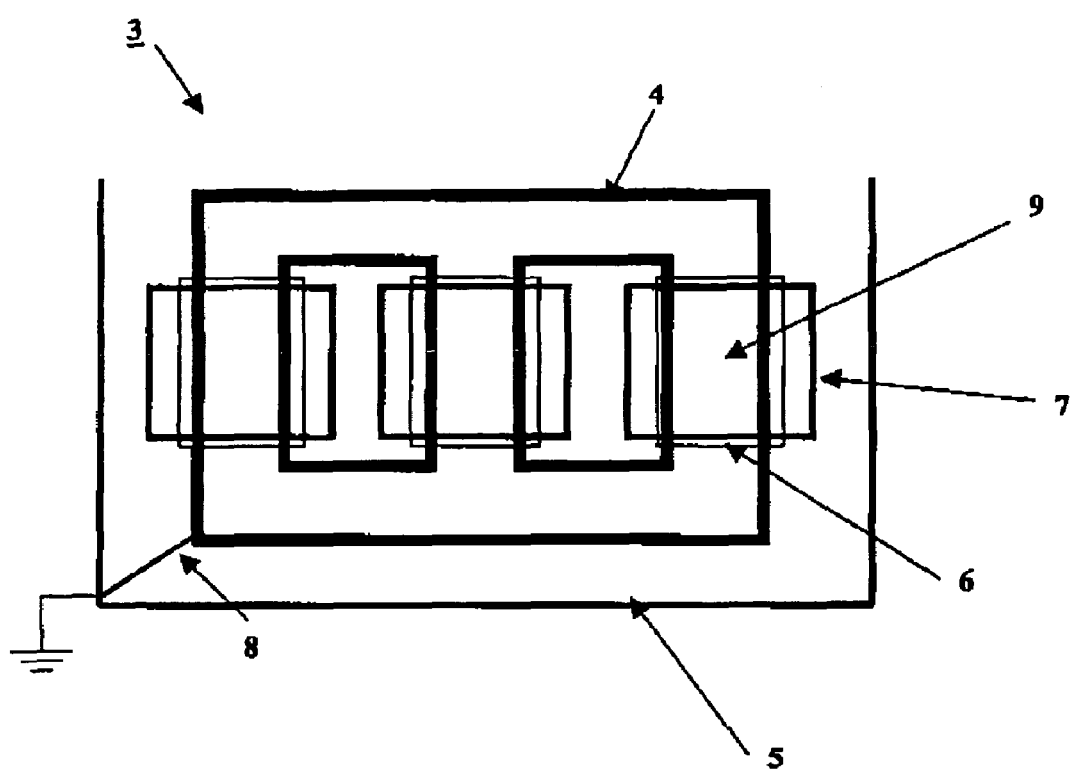
FIG. 2 is a diagram of a three-phase transformer.

FIG. 2 is a diagram of a three-phase transformer 3.
The three-phase transformer 3 comprises:
a magnetic circuit 4;
a tank 5;
three low voltage windings 6; and
three high voltage windings 7.

Each pair of high and low voltage windings corresponds to one phase of the transformer and is associated with a respective core 9 of the circuit 4. The three phases of the transformer are referred to below respectively as A, B, and C.

The magnetic circuit 4 and the tank 5 are connected together by a connection 8 and they are both grounded.

Three impedance measurements can be performed respectively for high voltage and for low voltage.

Thus, if a fault is suspected on one of the high voltage windings of the transformer, the gain of that winding is measured as a function of frequency, and the same measurement is performed on another one of the high frequency windings, after which the respective gains of said two windings are compared. It should be observed that a third measurement is also possible by using the third high voltage winding.

It is also possible to make a comparison between measurements taken on a winding suspected of being faulty and measurements taken previously on the same winding. It is also possible to compare measurements taken on a suspect winding with measurements taken on an equivalent winding of another transformer of the same design.

Figure 3:
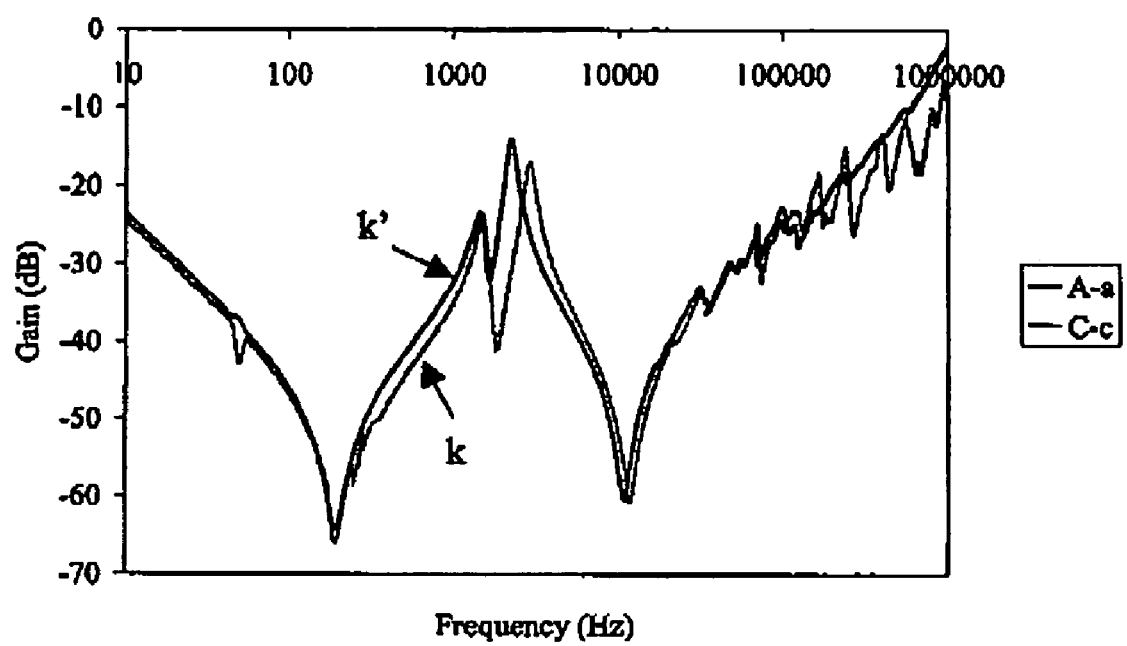
FIG. 3 shows the respective gains as a function of frequency for two high tension windings of two of the phases of a three-phase transformer.

By way of example, FIG. 3 shows the respective gains k and k' of two high voltage windings for the phases C and A respectively of a three-phase transformer of the kind shown in FIG. 2.

The gains k and k' are shown for frequency varying over the range 10 Hz to 1 MHz.

A fault is suspected to be present on the high frequency winding of phase C that corresponds to gain k.

In order to determine the presence of a fault, if any, and to diagnose that fault, the method of the invention comprises calculating six parameters.

The first three parameters are the correlation coefficients $\rho_1$, $\rho_2$, and $\rho_3$ between $\underline{k}$ and k' as calculated over the following three frequency ranges: [1 kHz to 10 kHz], [10 kHz to 100 kHz], and [100 kHz to 1 MHz].

For two sets of n numbers X $\{x_1, x_2, \ldots, x_n\}$ and Y $\{y_1, y_2, \ldots, y_n\}$, the correlation coefficient $\rho$ is defined by the following equation:

$$\rho = \sum_{i=1}^{n} x_i y_i \Big/ \sqrt{\sum_{i=1}^{n} x_i^2 \sum_{i=1}^{n} y_i^2}$$

The fourth parameter is defined as being the relative change in the minimum gain $CR_k$ at low frequency, i.e. at a frequency value of less than 10 kHz. Thus, if $k_m$ is the minimum gain of the impedance to be analyzed and $k'_m$ is the minimum gain of the reference impedance, then the coefficient of relative change in minimum gain $CR_k$ is defined by the equation:

$$CR_k = \frac{k_m}{k'_m}$$

The fifth parameter is defined as being the relative change in the fundamental resonant frequency $CR_f$. The fundamental resonant frequency is the first resonant frequency in each of the gains k and k'. It the respective fundamental resonant frequencies of the gains k and k' are written f and f', then the parameter $CR_f$ is defined by the equation:

$$CR_f = \frac{f}{f'}$$

The sixth parameter is defined as being the relative change in the number of resonant frequencies lying in the range 100 kHz to 1 MHz. If the numbers of resonant frequencies in k and k' over the range 100 kHz to 1 MHz are written respectively n and n', then the parameter $CR_n$ is defined by the equation:

$$CR_n = \frac{n}{n'}$$

Each measurement of the gain k compared with a measurement of the reference gain k' thus corresponds to the following sextuplet of parameters $\{\rho_1, \rho_2, \rho_3, CR_k, CR_f, CR_n\}$.

These parameters can be calculated either by using a computer tool or by an operator using a MSExcel® or other spreadsheet.

Thus, by calculating these parameters for the curves shown in FIG. 3, the following values are obtained:

$\rho_1 = 0.7483$
$\rho_2 = 0.9797$
$\rho_3 = 0.8577$
$CR_k = 0.98717$
$CR_f = 1$
$CR_n = 1.8333$ Thereafter, each of these values is associated with a code. These codes are summarized in Table 1 below.

TABLE 1

| Parameters | Values | Codes |
|---|---|---|
| ρ (valid for all frequency ranges) | Normal range | 0 |
| | >0.7000 | 1 |
| | <0.7000 | 2 |
| $CR_f$ | <normal range | 9 |
| | Frequency eliminated | 8 |
| | Normal range | 0 |
| | Normal range to 1.25 | 1 |
| | 1.25 to 1.5 | 2 |
| | 1.5 to 5 | 3 |
| | >5 | 4 |
| $CR_k$ | >normal range | 9 |
| | Normal range | 0 |
| | >0.8 | 1 |
| | 0.2 to 0.8 | 2 |
| | <0.2 | 3 |
| $CR_n$ | Normal range | 0 |
| | >normal range | 1 |

Thus, six codes can be associated with each sextuplet $\{\rho_1, \rho_2, \rho_3, CR_k, CR_f, CR_n\}$.

The term "normal range" means that the parameter lies within a range of variation that is referred to as being "normal".

This normal range of variation depends on the winding used for the reference measurement. Table 2 summarizes normal variations when the same winding is used for the analysis measurement and for the reference measurement.

TABLE 2

| Parameters | Normal ranges |
|---|---|
| ρ (valid for all frequency ranges) | [0.9950 to 1.0000] |
| $CR_f$ | [0.9000 to 1.1000] |
| $CR_k$ | $\left[\frac{k'_m - 6}{k'_m} \text{ to } \frac{k'_m + 6}{k'_m}\right]$ |
| $CR_n$ | 1.2000 |

Table 3 summarizes the normal variations when a different winding is used as the reference (as shown in FIG. 3).

TABLE 3

| Parameters | Normal ranges |
|---|---|
| ρ (valid for all frequency ranges) | [0.9750 to 1.0000] |
| $CR_f$ | [0.6500 to 1.1000] |
| $CR_k$ | $\left[\frac{k'_m - 6}{k'_m} \text{ to } \frac{k'_m + 6}{k'_m}\right]$ |
| $CR_n$ | 1.2000 |

The parameters $\{\rho_1, \rho_2, \rho_3, CR_k, CR_f, CR_n\}$ for the curves shown in FIG. 3 thus take on the codes: 101001.

When the six codes have been determined, the invention moves onto a step of comparing the six codes with codes recorded in a search table as shown in Table 4.

TABLE 4

| Type of fault | $\rho_1$ | $\rho_2$ | $\rho_3$ | $CR_f$ | $CR_k$ | $CR_n$ |
|---|---|---|---|---|---|---|
| 1) No fault | 0 | 0 | 0 | 0 | 0 | 0 |
| 2) Poor grounding of tank (high resistance) | 0 | 0 | 0-1 | 0 | 0 | 0 |
| 3) No grounding of tank | 0 | 0 | 0-1 | 0-9 | 0-1 | 0 |
| 4) No grounding of magnetic circuit | 0 | 0 | 0 | 0-9 | 0-1 | 0 |
| 5) Closed loop grounded | 0 | 0 | 0 | 0-9 | 0 | 0 |
| 6) Closed loop at floating potential | 0 | 0 | 0-1 | 0-9 | 0 | 0 |
| 7) Additional turn short circuited (same phase) | 0-1-2 | 0 | 0 | 3 | 2-3 | 0 |
| 8) Fault between terminals of winding (winding under analysis affected) | 0-1-2 | 0-1-2 | 0-1-2 | 8 | 3 | 0 |
| 9) Fault between winding terminals (another winding on the same phase affected) | 0-1-2 | 0-1-2 | 0 | 8 | 3 | 0 |
| 10) A turn short circuited | 0-1-2 | 0 | 0 | 0 | 0-1-2 | 0 |
| 11) A plurality of turns short circuited | 0-1-2 | 0-1 | 0-1 | 4 | 2 | 0 |
| 12) Short circuit on the sole adjacent phase | 0-1 | 0 | 0 | 2 | 0 | 0 |

TABLE 4-continued

| Type of fault | $\rho_1$ | $\rho_2$ | $\rho_3$ | $CR_f$ | $CR_k$ | $CR_n$ |
|---|---|---|---|---|---|---|
| 13) Short circuit on a phase other than the sole adjacent phase | 0-1 | 0 | 0 | 1 | 0 | 0 |
| 14) Winding displaced or buckling of inner winding | 0-1 | 0-1 | 0 | 0 | 0 | 0 |
| 15) Winding damaged | 0 | 0 | 0-1 | 0 | 0 | 0-1 |
| 16) Winding displaced and damaged | 0-1 | 0-1 | 0-1 | 0 | 0 | 0-1 |
| 17) Poor continuity | 0-1-2 | 0-1-2 | 0-1-2 | 0-1 | 9 | 0 |
| 18) One of the terminals of the winding being measured is grounded | 1-2 | 0-1 | 0-1 | 0 | 0 | 0-1 |
| 19) One of the terminals of a phase other than that of the winding being measured is grounded | 1-2 | 0-1-2 | 0 | 9-0 | 0-1-2 | 0-1 |
| 20) One of the terminals of another winding of the same phase as the winding being measured is grounded | 0 | 0 | 0-1 | 0 | 0 | 0-1 |

Comparing the calculated parameters with the search table as shown in Table 4 can be performed by a computer program developed in a Matlab® environment.

The following explanation of faults is given with reference to FIG. 2.

Faults 2 and 3 correspond to poor grounding of the tank 5. With fault 3, there is no grounding while with fault 2, the tank is grounded with high resistance between the tank 5 and ground (greater than 50 Ω).

Fault 4 corresponds to no grounding of the magnetic circuit 4, i.e. to a break in the connection 8.

Faults 5 and 6 correspond to circulating current loops respectively connected to ground and to a floating potential. These loops cause the transformer to become heated.

Fault 7 corresponds to the presence of an additional turn creating a short circuit on the phase to which the winding under analysis belongs.

Fault 8 corresponds to a fault between the terminals of the winding under analysis i.e. to a short circuit of the entire winding.

Fault 9 corresponds to a fault between the terminals of a winding belonging to the same phase as the winding under analysis.

Fault 10 corresponds to a short circuit present on a turn of windings belonging to the same phase as the winding under analysis. This fault produces heating of the transformer.

Fault 11 corresponds to a short circuit present on a plurality of turns belonging to the same phase as the winding under analysis. This fault produces heating of the transformer.

Fault 12 corresponds to a short circuit fault such as a short circuit between turns, between terminals, or with an additional turn. It indicates that the fault is located on a phase adjacent to the phase on which the measurement is being performed and that the phase where the fault is located is the sole adjacent phase, i.e. immediately beside the phase where the measurement is being performed. Thus, if the fault is on the central core, analyzing other phases will give rise to this code since the central phase is indeed the only phase that is immediately beside both the left and the right phases.

Fault 13 also corresponds to a short circuit fault such as a host circuit between turns, between terminals, or on an additional turn. However it indicates that the fault is not on the sole phase located immediately beside the phase where the measurement is being performed. Thus, if the fault is found on the left-hand core, then analyzing the central phase will produce this code since there are actually two phases immediately beside the central phase, and not only one.

Fault 14 corresponds to the winding under analysis being displaced axially but without the winding being excessively damaged locally, or else it corresponds to buckling of an inner winding.

Fault 15 corresponds to localized mechanical damage on the winding under analysis.

Fault 16 combines faults 14 and 15.

Fault 17 corresponds to poor electrical continuity in the winding under analysis. This poor continuity may be associated with a poor measurement contact.

Fault 18 corresponds to one of the terminals of the winding under analysis being grounded.

Fault 19 corresponds to one of the terminals of a winding belonging to a phase other than the winding under analysis being grounded.

Fault 20 corresponds to one of the terminals of a winding other than the winding under analysis being grounded, said other winding nevertheless belonging to the same phase.

Faults 18, 19, and 20 are more indicative of faults in making a measurement.

Thus, by comparing the codes 101001 associated with the curves of FIG. 3 with the faults listed in Table 4, it can be deduced that a fault of type 16 or 18 is present. A measurement problem of type 18 can be eliminated by performing the measurement again and by determining whether or not a fault of type 16 is present, i.e. a winding that is damaged or displaced.

Naturally, the invention is not limited to the embodiment described above.

In particular, the steps of calculating the parameters and of searching the search table as performed by software means could also be performed by operators.

Similarly, the code values are given by way of indication, but they could be replaced by other values adapted to other software tools.

What is claimed is:

1. A method of diagnosing a fault on a transformer winding, the method comprising the steps of:
    measuring the impedance on said winding as a function of frequency, said measurement being represented in the form of a first voltage gain;
    comparing said impedance measurement with a reference measurement represented in the form of a second voltage gain, said comparing includes calculating three first parameters, each of said three first parameters being a correlation coefficient, between said first and second gains over three different frequency ranges;
    determining the relative variation of at least a fourth parameter, said fourth parameter being a physical magnitude characteristic of said transformer, said relative variation being obtained by comparing said first and second gains;

associating at least one diagnosis code with each of said three first parameters and said relative variation of said fourth parameter; and determining the presence of the fault and identifying said fault by comparing each diagnosis code with a reference code.

2. A method according to claim 1, wherein said fourth parameter is selected from minimum gain, fundamental resonant frequency, and number of resonant frequencies present above a predetermined frequency.

3. A method according to claim 2, wherein said minimum gain is determined for a frequency below 10 kHz.

4. A method according to claim 1, wherein said three different frequency ranges are respectively: [1 kHz to 10 kHz], [10 kHz to 100 kHz], and [100 kHz to 1 MHz].

5. A method according to claim 1, including a step of determining the relative variation of at least a fifth parameter and a sixth parameter, said fifth and sixth parameters being characteristics of said transformer, said relative variation being obtained by comparing said first and second gains.

6. A method according to claim 5, wherein said fourth parameter is a minimum gain, said fifth parameter is a fundamental resonant frequency, and said sixth parameter is a number of resonant frequencies present above a predetermined frequency.

7. A method according to claim 1, wherein each of said diagnosis codes indicates whether a respective one of said parameters belongs to a predetermined range of values.

8. A method according to claim 1, wherein the reference codes are stored in a search table.

9. A method according to claim 1, wherein one of said three different frequency ranges covers the range from 1 kHz to 10 kHz.

10. A method according to claim 1, wherein one of said three different frequency ranges covers the range from 10 kHz to 100 kHz.

11. A method according to claim 1, wherein one of said three different frequency ranges covers the range from 100 kHz to 1 MHz.

12. A method according to claim 5, wherein said fourth parameter is a minimum gain.

13. A method according to claim 5, wherein said fifth parameter is a fundamental resonant frequency.

14. A method according to claim 5, wherein said sixth parameter is a number of resonant frequencies present above a predetermined frequency.

* * * * *